United States Patent [19]

Hasegawa

[11] Patent Number: 5,051,787
[45] Date of Patent: Sep. 24, 1991

[54] SUPERCONDUCTOR STORAGE DEVICE AND MEMORY USING SUPERCONDUCTOR STORAGE DEVICES AS MEMORY CELLS

[75] Inventor: Shuji Hasegawa, Chiba, Japan

[73] Assignee: Hitachi, Ltd., Tokyo, Japan

[21] Appl. No.: 525,546

[22] Filed: May 18, 1990

[30] Foreign Application Priority Data

May 22, 1989 [JP] Japan .................................. 1-126587

[51] Int. Cl.⁵ ............................................ H01L 39/22
[52] U.S. Cl. ......................................... 357/5; 307/306;
307/462; 365/160; 365/161; 365/162; 505/835;
505/836; 505/839; 505/840
[58] Field of Search ..................... 357/5; 307/277, 306,
307/245, 462; 365/160, 161, 162; 505/834–841,
874, 865, 831

[56] References Cited

U.S. PATENT DOCUMENTS

| 3,482,220 | 8/1966 | Cosentino et al. | 365/160 |
|---|---|---|---|
| 3,626,391 | 12/1971 | Anacker | 357/5 |
| 3,936,677 | 2/1976 | Fulton et al. | 357/5 |
| 4,764,898 | 8/1988 | Miyahara et al. | 357/5 |

FOREIGN PATENT DOCUMENTS

| 1289878 | 3/1967 | Fed. Rep. of Germany | 365/160 |
|---|---|---|---|
| 110678 | 1/1989 | Japan | 357/5 |
| 121974 | 1/1989 | Japan | 357/5 |

OTHER PUBLICATIONS

"Flux Programmable Memories", Faris, IBM Technical Disclosure Bulletin, vol. 21, #1, Jun. 1978, pp. 406–407.
"Dynamic Random Access Memory for Computer", Susumu, European Patent Application 0,330,743, A2, Sep. 1989.
IBM Journal of Research and Development, vol. 24, No. 2, Mar. 1980, pp. 113–129.
App., Phys. Lett. 39(12), 15 Dec. 1981, pp. 992–993.
Physical Review, vol. 115, No. 3, Aug. 1, 1959, pp. 485–491.

*Primary Examiner*—Rolf Hille
*Assistant Examiner*—Steven Loke
*Attorney, Agent, or Firm*—Kenyon & Kenyon

[57] ABSTRACT

A superconductor storage device and a memory constructed by arranging a plurality of superconductor storage devices are disclosed. The superconductor storage device is comprised of a word line, a write-in line, a first loop of superconductor composed of two branch paths of superconductor connected to the word line so as to allow a current flowing in the word line to be retained in the first loop, a weakly coupling portion inserted in at least one of the two branch paths, the weakly coupling portion being subject to the influence of a magnetic field generated by the write-in line to control the retention of the current in the first loop, and a second loop of normal conductor provided so as to be magnetically coupled with the first loop, the second loop including an input path and an output path which allow the application of a voltage to the second loop and two branch paths of normal conductor which makes a loop-wise connection between the input path and the output path.

24 Claims, 10 Drawing Sheets

FIG. IA
PRIOR ART
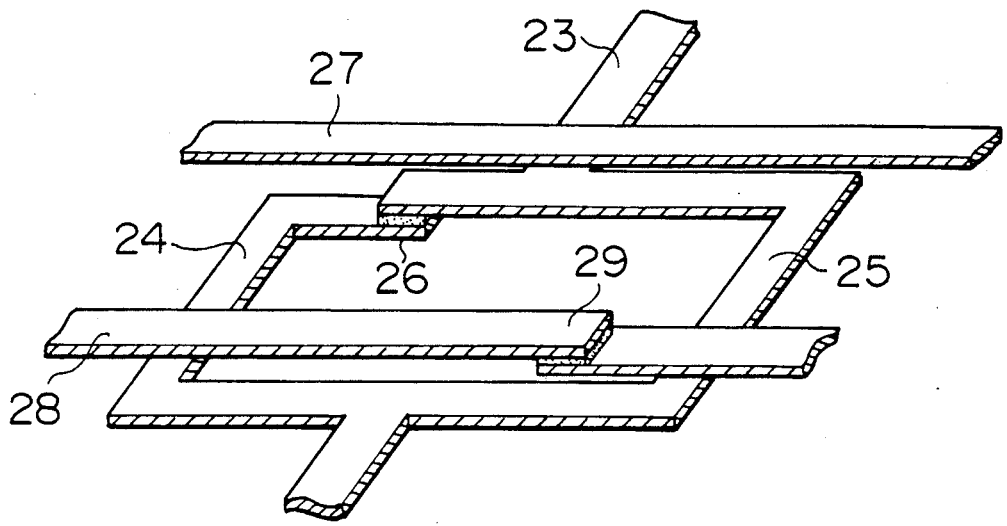
FIG. IB
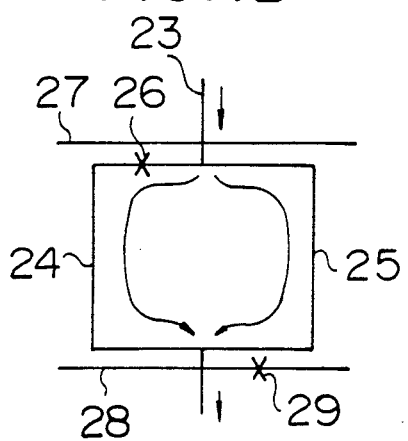
FIG. IC
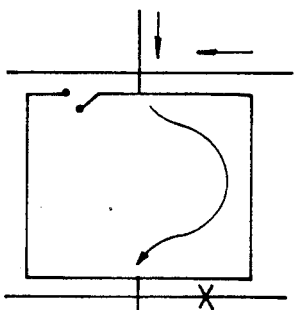
FIG. ID
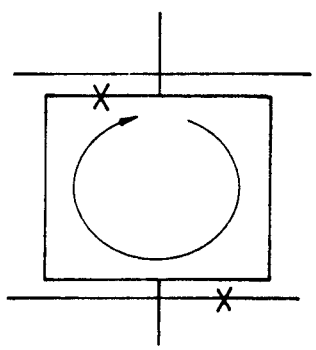
FIG. IE
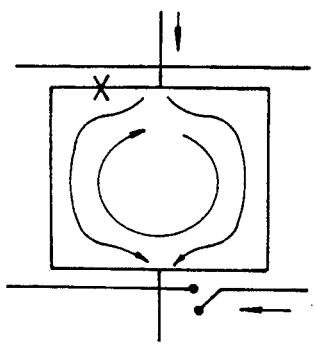

NUMBER OF ABRIKOSOV QUANTA

SUPERCONDUCTOR STORAGE DEVICE AND MEMORY USING SUPERCONDUCTOR STORAGE DEVICES AS MEMORY CELLS

BACKGROUND OF THE INVENTION

The present invention relates to a storage device and a memory for computers of the like in which a magnetic flux retained in a superconductor or a magnetic flux generated by a supercurrent is used as a carrier of information, and more particularly to a superconductor storage device which has novel means for reading out stored information and to a memory which is constructed using such superconductor storage devices as memory cells.

A superconductor storage device using a superconductor is conventionally known among storage devices in which a magnetic flux is used as a carrier of information. In the superconductor storage device, information is stored utilizing the fact that a magnetic flux produced by a supercurrent (or persistent current) flowing in the superconductor is retained with no loss of energy. The superconductor storage device is generally classified into two (first and second) types.

In the first type of superconductor storage device, logical values of "1" and "0" are discriminately stored in accordance with the (clockwise or counterclockwise) direction of the loop of a persistent (or permanent) current circulating a superconducting ring or the presence/absence of the pertistent current loop, as described by, for example, IBM Journal of Research and Development, Vol. 24, No. 2, March 1980, pp. 113–129. In other words, the logical values are discriminately stored in accordance with the direction or presence/absence of a magnetic flux which is produced by the persistent current and passes through a hole of the superconducting ring. Read-out of information in this type of storage device is effected in accordance with whether or not a Josephson junction magnetically coupled with the superconducting ring takes a resistive state.

An example of the first type of storage device is shown in FIGS. 1A to 1E. The shown device includes a loop of superconductor composed of first and second branch paths 24 and 25 of superconductor, a word line 23 for taking a supercurrent in and out of the superconductor loop, a Josephson junction 26 provided in the course of the first branch path 24, a write-in line 27 magnetically coupled with the Josephson junction 26, and a read-out line 28 having a Josephson junction 29 magnetically coupled with the second branch path 25. The storage scheme of this superconductor storage device or cell is as follows. When write-in of a logical value "1" is desired, a current is first flown in the word line 23 (see FIG. 1B) and a proper current is then flown in the write-in line 27 to generate a magnetic field. Thereby switching the Josephson junction 26 to a resistive state (see FIG. 1C). Thereafter, the current through the write-in line 27 is cut off and the current through the word line 23 is then cut off, leaving a clockwise circulating persistent current loop in the superconductor loop (see FIG. 1D). In this case, the product of the inductance of the superconductor loop and the persistent current is integer times of a flux quantum $\phi_0$ ($=2\times10^{-15}$ Wb). When write-in of a logical value "0" is desired, a current is flown in the write-in line 27 with no current being flown in the word line 23, so that the Josephson junction 26 is switched to a resistive state. Thereby, no persistent current loop is produced in the superconductor loop. Read-out of the stored information is performed by flowing a proper current in the word line 23 after the Josephson junction 29 has been biased by flowing a proper current in the read-out line 28. In the case where the information "1" is stored and a persistent current is flowing in the superconductor loop, a part of the current injected from the word line 23 and the persistent current are flown in a superimposed form into the second branch path 25 magnetically coupled with the Josephson junction 29 so that the Josephson junction is switched to a resistive state (see FIG. 1E). Thereby, the judgment of the stored information as being "1" is made. On the other hand, in the case where the stored information is "0" or no persistent current loop is present in the superconductor loop, only the current injected from the word line 23 is flown in the second branch path 25 so that the Josephson junction 29 is maintained in a superconducting or zero-voltage state. Thereby, the judgment of the stored information as being "0" is made.

Another example of the conventional persistent current loop type of storage device is shown in FIGS. 2A to 2E. In the shown storage circuit, logical values are stored in accordance with the direction of a persistent current flowing in a superconductor loop, that is, with a clockwise circulating persistent current representing a logical value "0" and a counterclockwise circulating persistent current representing a logical value "1". Like the device of FIG. 1A, this superconductor storage device includes a loop of superconductor composed of first and second branch paths 24 and 25 of superconductor, a word line 23 for taking a supercurrent in and out of the superconductor loop, Josephson junctions 41 and 42 respectively provided in the courses of the first and second branch paths 24 and 25, a write-in line 27 magnetically coupled with the Josephson junctions 41 and 42, and a read-out line 28 having a Josephson junction 43 magnetically coupled with the second branch path 25. The storage scheme of this superconductor storage device or cell is as follows. When write-in of a logical value "1" is to be made, a proper current is first flown in the word line 23 (see FIG. 2B) and a proper current is then flown in the write-in line 27 to switch the Josephson junction 42 to a resistive state (see FIG. 2C). Thereafter, the current through the write-in line 27 is cut off and the current through the word line 23 is then cut off, leaving a counterclockwise circulating persistent current loop in the superconductor loop (see FIG. 2D). When write-in of a logical value "0" is to be made, a similar operation is performed with the inversion of the direction of the current flown in the word line 23 upon write-in of the logical value "1", thereby leaving a clockwise circulating persistent current loop in the superconductor loop. Read-out of the stored information is performed by flowing a proper current in the word line 23 after Josephson junction 43 has been biased by flowing a proper current in the read-out line 28 from the left toward the right and shown in FIG. 2E. IN the case where the information "1" is stored (or the counterclockwise circulating persistent current loop is retained), a part of the current injected from the word line 23 and the retained persistent current are cancelled in the second branch path 25 magnetically coupled with the Josephson junction 43, thereby maintaining the Josephson junction 43 in a zero-voltage state. On the other hand, in the case where the stored information is "0", a part of the current injected from the word line 23 and the retained persistent current are flown in the same direction into the second branch path 25, thereby switching the Josephson junction 43 to a resistive state. In this manner, the stored information can be read out with the discrimination of "1" or "0".

The second type of superconductor storage device, an Abrikosov flux quantum $\phi_0$ generated in a superconductor thin film is used as a carrier of information, as described in Appl. Phys. Lett. 39(12), 15 December 1981, pp. 992–993. The Abrikosov flux quantum can maintain the magnetic flux with no loss of energy since it is produced by a persistent current flowing around the flux quantum. Logical values of "1" and "0" are discriminately stored in accordance with the quantity, the presence/absence or the direction of the Abrikosov flux quantum. Read-out of information is effected by use of a phenomenon that the critical current value of a Josephson junction is reduced by applying a magnetic field of the Abrikosov flux quantum to the Josephson junction.

An example of the above type of superconductor storage device is shown in FIG. 3. The shown apparatus includes a thin superconductor 31 for retaining an Abrikosov flux quantum therein, another superconductor 32, a flux quantum detecting Josephson junction 33 having a lower electrode provided by a part of the superconductor 31 and an upper electrode provided by the superconductor 32, a write-in line 34 provided near one end 35 of the superconductor 31, and a superconductor 36 surrounding the superconductor 31 except the end 35 thereof and having a thickness larger than that of the superconductor 31. $\phi_0$ notionally represents the Abrikosov flux quantum retained in the superconductor 31. In this superconductor storage device, the presence and absence of an Abrikosov flux quantum to be retained in the superconductor 31 correspond to logical values "1" and "0", respectively. Namely, if the Abrikosov flux quantum is retained in the superconductor 31, the flux quantum gives an influence on the Josephson junction 33 to reduce the maximum super-current at the Josephson junction 33. This phenomenon is utilized to have the change of the maximum supercurrent correspond to the storage state "1" or "0". Write-in of "1" is performed by flowing a current of a predetermined direction in the write-in line 34 to generate a magnetic field so that an Abrikosov flux quantum having a predetermined direction (for example, an upward direction) is internally generated in the superconductor 31 from the end 35 thereof. On the other hand, write-in of "0" is performed in either one of different ways which depends on the storage state before the write-in. Namely, if the storage state before the write-in is "1", a current of the reverse direction is flown in the write-in line 34 to internally generate an Abrikosov flux quantum of a downward direction in the superconductor 31 so that it is pair-annihilated together with the Abrikosov flux quantum of the upward direction, thereby making the number of Abrikosov flux quanta zero. If the storage state before the write-in is "0", no current is flown in the write-in line 34 so that the state is maintained as it is, thereby substantially effecting the write-in of "0". Read-out of the stored information is performed by supplying a proper current to the Josephson junction 33. Namely, if a bias current having a value between the maximum supercurrent when an Abrikosov flux quantum is retained in the superconductor 31 and that when no Abrikosov flux quantum is retained is supplied to the Josephson junction 33, a voltage is generated across the Josephson junction 33 (or the Josephson junction 33 takes its resistive state) in the case where the Abrikosov flux quantum is retained and the zero-voltage state of the Josephson junction 33 is maintained in the case no Abrikosov flux quantum is retained.

SUMMARY OF THE INVENTION

Information read-out means of each of the above-mentioned conventional superconductor storage devices uses a Josephson element for read-out of information. However, it is generally difficult to fabricate with a better yield a Josephson element having a uniform critical current since the thickness of an insulating film of the Josephson element is so small as the order of 10 Å and hence it is difficult to control the film thickness. Therefore, information read-out means using no Josephson element is preferable but such read-out means has not hitherto been proposed.

Further, in the information read-out means of the conventional superconductor storage device, an operation for read-out of information is complicated or it is necessary to supply a current to the Josephson junction to measure a voltage thereacross in order to know whether or not the Josephson junction takes its resistive state. Therefore, there is a problem that the wiring becomes complicated.

An object of the present invention is to provide a storage device and a memory having novel read-out means in which the above problems are solved.

Another object of the present invention is to provide a storage device and a memory having novel information read-out means which uses no Josephson element.

A further object of the present invention is to provide a storage device and a memory the fabrication of which is facilitated.

A still further object of the present invention is to provide a storage device and a memory suitable for high densification.

According to one aspect of the present invention, the above object is achieved by providing a storage device comprising information write-in means for generating and annihilating a predetermined magnetic flux in accordance with information to be stored, information retaining means for retaining the magnetic flux therein, and information read-out means for detecting the magnetic flux retained in the information retaining means, the information read-out means including magnetic flux detecting means placed to be subject to the influence of the magnetic flux retained in the information retaining means for splitting a material wave (de Broglie wave) having charges into a plurality of material waves, allowing the plurality of material waves to travel, and allowing the plurality of material waves to superimpose and interfere with each other. A memory constructed using such storage devices is also provided.

According to another aspect of the present invention, the above object is achieved by providing a storage device comprising information write-in means for generating and annihilating a predetermined magnetic flux in accordance with information to be stored, information retaining means for retaining the magnetic flux therein, and information read-out means for detecting the magnetic flux retained in the information retaining means, the information read-out means including a waveguide placed to be subject to the influence of the magnetic flux retained in the information retaining means for making a material wave having charges incident with a coherency thereof being kept, branching the incident material wave into a plurality of parts and making the material wave parts confluent again. A memory constructed using such storage devices is also provided.

The present invention provides a storage device in which the property of charged particles such as electrons, holes, excitons (for example, polarons), or ions as a material wave is utilized to detect a magnetic flux produced by an Abrikosov flux quantum or a persistent current loop, thereby reading out stored information. The present invention further provides a memory which is constructed using such storage devices. In the following, explanation will be made taking an electron wave as the material wave by way of example. Similar explanation holds for the other kinds of material waves.

The storage device of the present invention has an information read-out circuit of an "interference type of electron waveguide" structure in which an incident electron wave with a coherency thereof being kept is split at a branch point into two parts allowed to propagate along two branch paths, respectively, and the electron wave parts from the two branch paths are superimposed (or combined) and interfere at a confluence point and emanate from an exit path. The coherency of the electron waves propagating in the two branch paths is maintained by selecting a distance from the branch point to the confluence point to be equal to or smaller than the order of a phase coherence distance of electrons in a material which forms the branch paths. A magnetic flux produced by an Abrikosov flux quantum or a persistent current is passed through a space inside or enclosed by the two branch paths. The two branch paths of the "interference type of electron waveguide" are made of a normal conductor.

According to the Aharonov-Bohm effect described in Physical Review, Vol. 115, No. 3, (1959) pp. 485-491, when an electron wave is propagated with a coherency thereof being maintained and then split into two electron waves, a phase difference between the two electron waves is caused by the quantity of a magnetic flux (or the total magnetic flux) through a space enclosed by the trajectories of the two electron waves. Owing to this effect, by passing the magnetic flux produced by the Abrikosov flux quantum or the persistent current through the space enclosed by the two electron wave branch paths, the intensity of the electron wave propagating from an incidence path to the exit path of the information read-out circuit of the present invention, that is, a current value is changed. Thus, the presence/absence, the quantity or the direction of the magnetic flux is detected, thereby effecting the read-out of the stored information.

The storage device of the present invention implemented so as to detect a magnetic flux as a carrier of information by use of the property of particles such as electrons as a material wave can be said to be essentially suitable for miniaturization of a memory cell or high densification of a storage device or memory.

BRIEF DESCRIPTION OF THE DRAWINGS

FIGS. 1A is a view showing the structure of one example of the conventional superconductor storage device;

FIGS. 1B to 1E are views useful in explaining information write-in and read-out operations of the storage device shown in FIG. 1A;

DESCRIPTION OF THE PREFERRED EMBODIMENTS

Figure 4A:
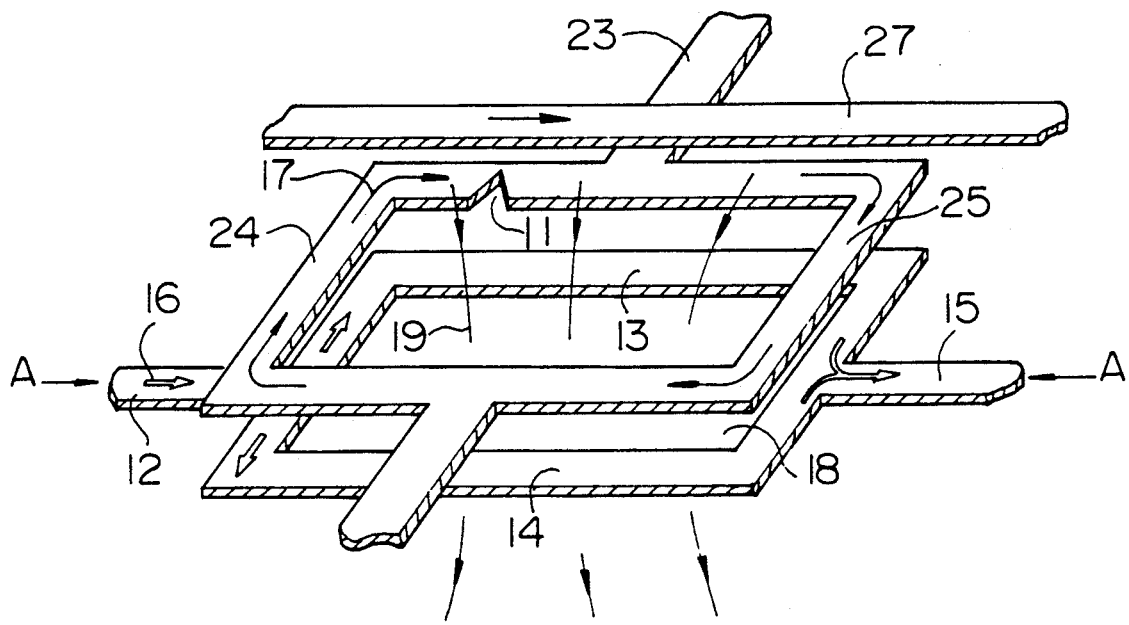
FIG. 4A is a view showing the structure of a superconductor storage device according to an embodiment of the present invention.

FIG. 4A shows the structure of a storage unit of a storage device according to an embodiment of the present invention. This storage device has a structure based on the first type (or persistent current loop type) of storage device mentioned as the prior art. Information write-in means and information retaining means of the storage device shown in FIG. 4A includes a loop of superconductor composed of first and second branch paths 24 and 25 of superconductor similar to that of the storage device shown in FIG. 1A, a word line 23 for taking a supercurrent in and out of the superconductor loop, a weakly coupling portion 11 provided in the course of the first branch path, and a write-in line 27 magnetically coupled with the weakly coupling portion 11. Information read-out means of the storage device includes an incidence path (or input path) 12, branch paths 13 and 14, and an exit path (or output path) 15 for electron wave which are made of a normal conductor and in which an electron wave is propagated with a coherency thereof being kept. The electron wave branch paths 13 and 14 are in close proximity to the superconductor loop of the first and second branch paths 24 and 25 with a thin insulating film being sandwiched therebetween. In FIG. 4A, the branch paths 13 and 14 and the branch paths 24 and 25 are shown apart from each other for convenience of illustration. The weakly coupling portion 11 may be a Josephson junction having a thin intervening insulating film, a point contact Josephson junction, or the like. Alternatively, the weakly coupling portion may be provided by actually forming a notch in the branch path, as shown in FIG. 4A. What is characteristic of the present invention is that the branch paths 24 and 25 serving as the information retaining means are made of a superconductor and the incidence path 12, the branch paths 13 and 14 and the exit path 15 for electron wave serving as the information read-out means are made of a normal conductor.

Figure 4B:
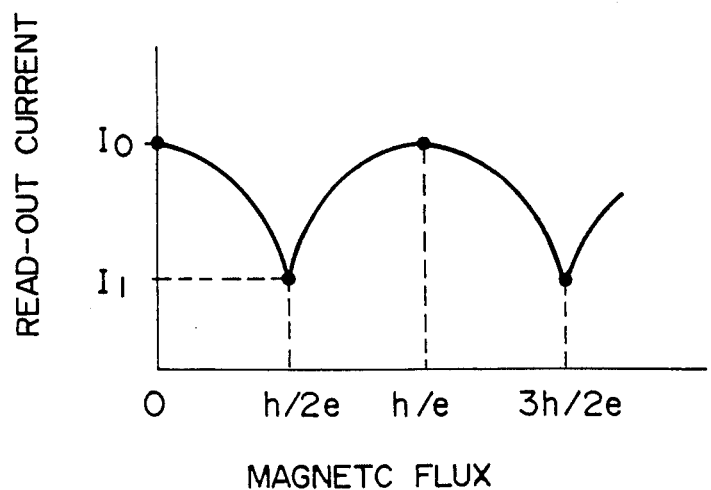
FIG. 4B is a graph showing the trapped magnetic flux versus read-out current characteristic of the storage device shown in FIG. 4A.

The operation of writing information into the superconductor loop and the discrimination of logical values "1" and "0" are effected by the presence/absence of a persistent current loop as in the conventional device shown in FIG. 1A. A method of reading out the stored information is different from the conventional method as follows. Namely, in the case where a persistent current loop 17 is generated and retained in the superconductor loop composed of the first branch path 24 and the second branch path 25 to generate a magnetic flux 19 so that the logical value "1" is stored, the magnetic flux 19 produced by the persistent current loop wholly passes through an opening 18 inside or enclosed by the branch paths 13 and 14. The total quantity of the magnetic flux (or the total magnetic flux) is quantized at integer times of (or in units of) a flux quantum $\phi_0 = h/2e$, where h is the Planck's constant and e is the electron charge. Then, owing to the above-mentioned Aharonov-Bohm effect, a read-out current 16 flowing when a constant voltage DC power source is connected between the incidence path 12 and the exit path 15 for electron wave, takes states indicated by dots on a characteristic curve (see FIG. 4B) which shows a relation with the quantity of the magnetic flux passing through the opening 18 enclosed by the branch paths 13 and 14. Accordingly, if a current having a magnitude allowing to produce the magnetic flux 19 amounting to odd times of $\phi_0$ is flown in the word line 23 upon write-in of the logical value "1", the read-out current 16 at this time assumes $I_1$. On the other hand, in the case where no persistent current loop is retained (or the logical value "0" is stored), the read-out current 16 assumes $I_0 (>I_1)$ as shown in FIG. 4B since no magnetic flux 19 is present. In this manner, the stored information can be discriminately read out by measuring $I_0$ and $I_1$. It is not always required that the area of the opening 18 enclosed by the branch paths 13 and 14 is accurately equal to a space defined by the first branch path 24 and the second branch path 25. The opening area may suffice so long as the magnetic flux of about $$\frac{1}{2} \cdot \frac{h}{2e} \text{ to } \frac{3}{2} \cdot \frac{h}{2e}$$

is allowed to pass. In this case, too, the discrimination of $I_0$ and $I_1$ is sufficiently possible.

The method of fabrication of the storage device of the present embodiment will be explained by virtue of FIG. 4C which shows a perspective view of a cross section taken along line A—A in FIG. 4A. An undoped GaAs layer 102 having a thickness of 1 μm and an Se-doped GaAs layer 103 having an impurity concentration of $1 \times 10^{19}$ cm$^{-3}$ and a thickness of 100 Å are successively formed on a GaAs substrate 101 by means of molecular beam epitaxy (MBE) method. The resultant structure is subjected to an ion etch using a mask and then the deposition of an SiO$_2$ layer 105 of 1000 Å thickness thereon. Further, an Nb layer 106 having a thickness of 500 Å is formed by sputtering and is patterned into a desired configuration by means of ion etch. On the resultant structure are successively formed an SiO$_2$ layer 107 of 1000 Å thickness by deposition and an Nb layer 108 of 500 Å thickness by sputtering which is in turn patterned into a desired configuration. The Se-doped GaAs layer 103 etched into a desired configuration provides the branch paths 13 and 14 shown in FIG. 4A, the Nb layer 108 provides the write-in line 27 and the Nb layer 106 provides the first and second branch paths 24 and 25 of the superconductor loop. An SiO$_2$ layer for protection to be provided on the Nb layer 108 is not shown in FIG. 4C as a matter of convenience for illustration.

Figure 4C:
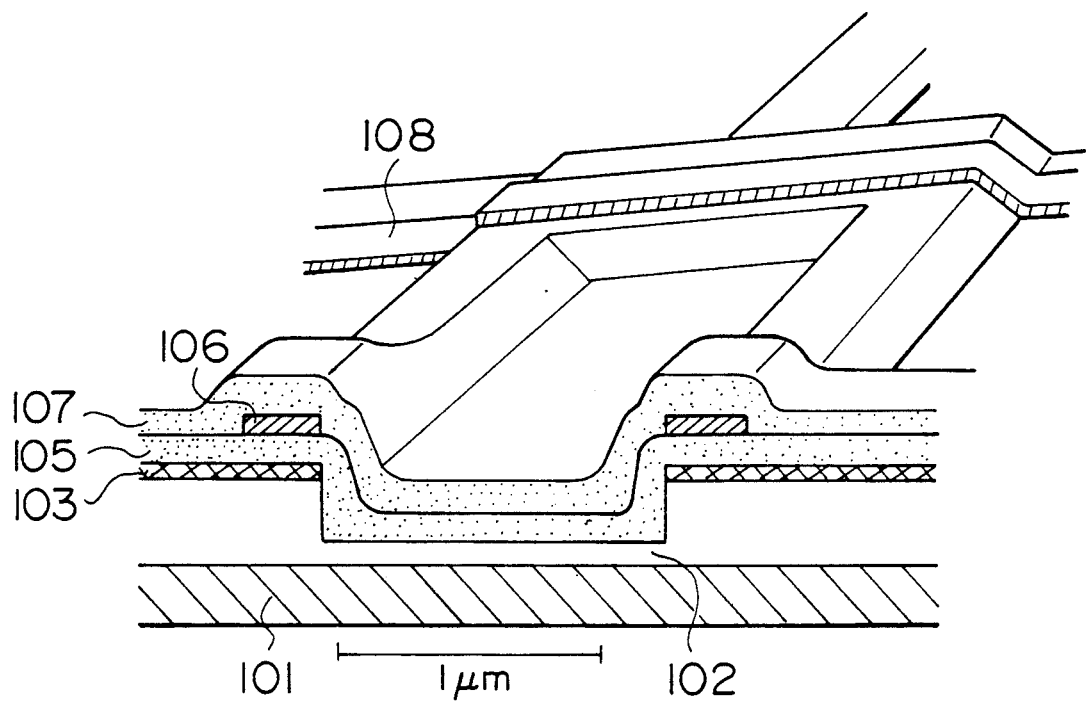
FIG. 4C is a perspective cross-sectional view of the memory cell of FIG. 4A useful in explaining a fabrication method thereof.

In the example described in conjunction with FIG. 4C, the write-in line 27 has been formed by the layer 108 of superconductor Nb for the purpose of reducing a power consumption. However, the write-in line may be formed by a normal conductor.

Figure 2A:
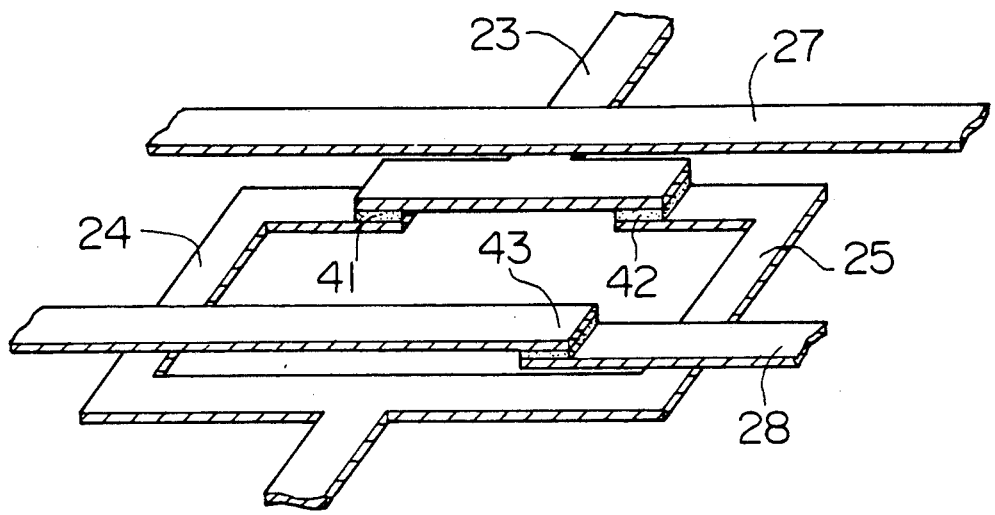
FIG. 2A is a view showing the structure of another example of the conventional superconductor storage device.
Figure 2B:
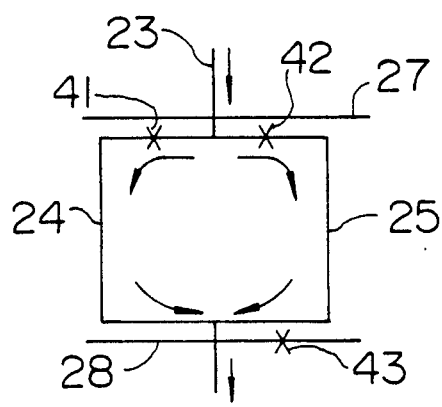
FIGS. 2B to 2E are views useful in explaining information write-in and read-out operations of the storage device shown in FIG. 2A.
Figure 2C:
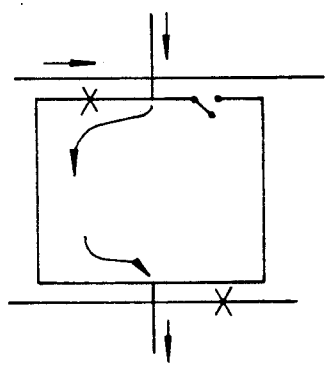
Figure 2D:
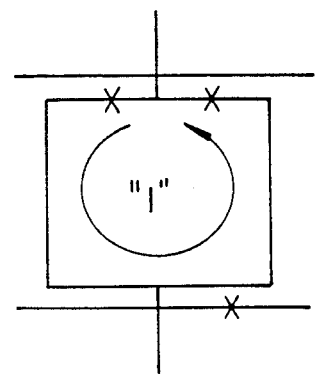
Figure 2E:
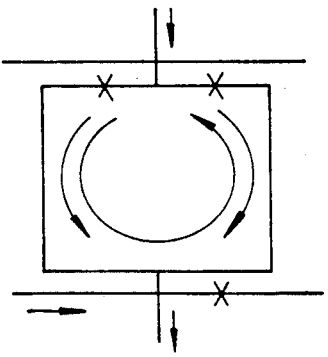
Figure 5A:
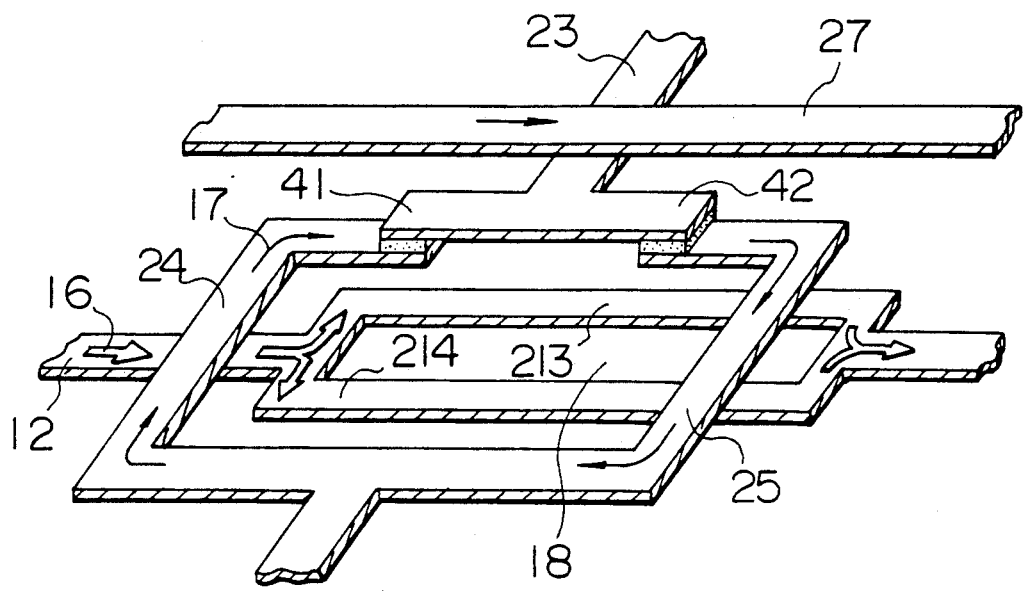
FIG. 5A is a view showing the structure of a superconductor storage device according to another embodiment of the present invention.

FIG. 5A is a view showing the structure of a superconductor storage device according to another embodiment of the present invention. In the storage device of the present embodiment, logical values "0" and "1" are discriminated in accordance with the (clockwise/counterclockwise) direction of a persistent current loop. Accordingly, a word line 23, first and second branch paths 24 and 25, Josephson elements 41 and 42, and a write line 27 which form information write-in means and information retaining means are similar to those shown in FIG. 2A.

Figure 5B:
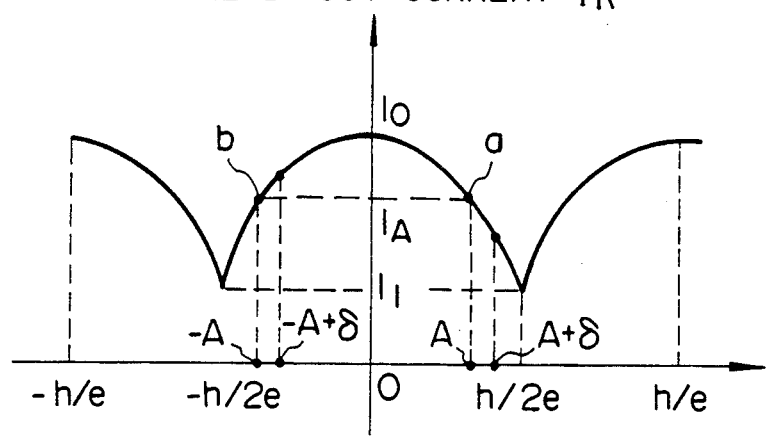
FIG. 5B is a graph showing the trapped magnetic flux versus read-out current characteristic of the storage device shown in FIG. 5A.

The construction of the present embodiment is different from that of the embodiment of FIG. 4A not only in the information write-in means and the information retaining means but also information read-out means. Namely, a noticiable difference of the structure of the present embodiment from that of the embodiment shown in FIG. 4A is that an opening 18 enclosed by electron wave branch paths 213 and 214 made of a normal conductor is smaller than an opening enclosed by first and second branch paths 24 and 25 forming a superconductor loop and partially extends to the outside of the superconductor loop. With such a structure, only a part of a magnetic flux produced by a persistent current loop 17 is allowed to pass through the opening 18 enclosed by the branch paths 213 and 214. Now provided that a clockwise circulating persistent current loop is producing a magnetic flux amounting to odd times of h/2e, for example, one time, the total magnetic flux passing through a space (or the opening 18) enclosed by the branch paths 213 and 214 is less than h/2e. Assume that this total magnetic flux is, for example, A as shown in FIG. 5B. Then, owing to the Aharonov-Bohm effect, the state of a read-out current at this time is exhibited by a point a on the magnetic flux versus read-out current curve shown in FIG. 5B or the read-out current is $I_4$. In the case where a counterclockwise circulating persistent current loop is retained, the read-out current takes a state indicated by a point b and is also $I_4$. Thus, the counterclockwise circulating persistent current loop is not discriminative from the clockwise circulating persistent current loop. However, if a small or minute current is flown in the write-in line 27, a magnetic flux produced by the small current cannot enter a space enclosed by the branch paths 213 and 214 and the superconductor loop because of the presence of the existing persistent current loop but passes through a space which is enclosed by the branch paths 213 and 214 and exists outside the superconductor loop. Provided that the quantity of the magnetic flux through the latter space is $\delta$, the total magnetic flux under the presence of the clockwise circulating persistent current loop amounts to $A+\delta$ with a decrease of read-out current from $I_A$ and the total magnetic flux under the presence of the counterclockwise circulating persistent current loop amounts to $-A+\delta$ with an increase of read-out current from $I_A$, as shown in FIG. 5B. In this manner, the stored information can be read out discriminating whether the retained persistent current is clockwise or counterclockwise. It is of course that notches such as the weakly coupling portion 11 shown in FIG. 4A may be used in place of the Josephson elements 41 and 42.

Figure 6:
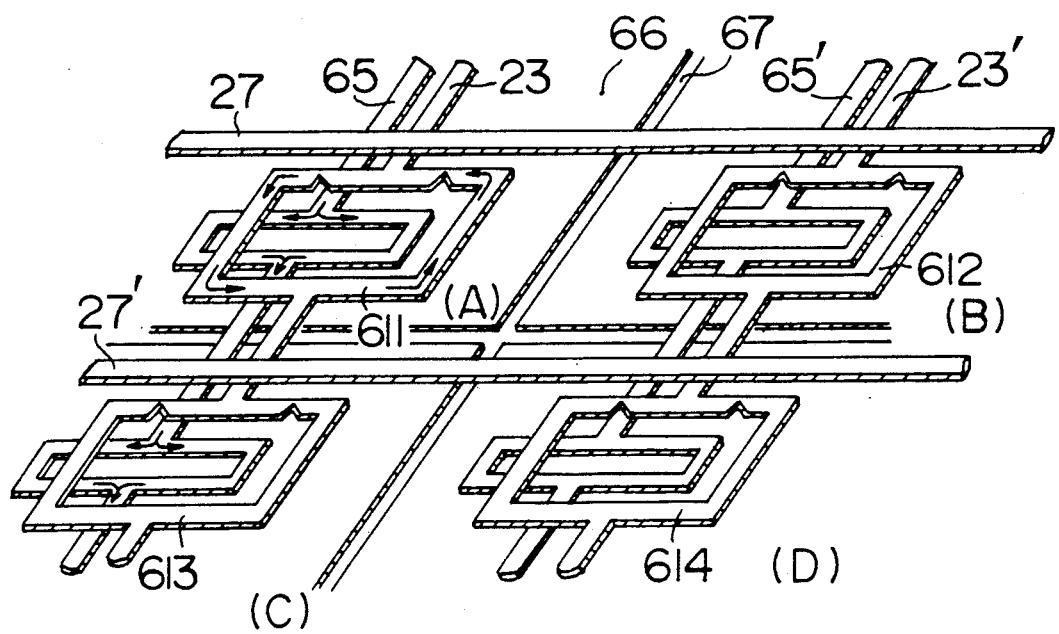
FIG. 6 is a view showing a 4-bit memory constructed using the storage device of FIG. 5A as a memory cell.

FIG. 6 is a schematic view of a 4-bit memory in which four storage devices each having the structure shown in FIG. 5A are arranged as memory cells (A), (B), (C) and (D). For example, when information is to be written into the memory cell (A), a write-in line 27 and a word line 23 are used to write a persistent current in a superconductor loop 611 through the operation explained in conjunction with the conventional device shown in FIGS. 1A to 1E. The writing of information into the memory cell (B) is made using the write-in line 27 and a word line 23'. When the information written in the memory cell (A) is to be read out, a read-out current is flown in a read-out line 65 made of normal conductor, then a small or minute current is flown in the write-line 27, thus the memory cell (A) is selected and information stored in the memory cell (A) is read out in accordance with the principle mentioned in conjunction with the embodiment shown in FIGS. 5A and 5B. In this memory, each memory cell is fabricated on the superconducting layer 66, by which undesirable external magnetic field, if any, would be shielded due to the Meissner effect. The superconducting layer 66 is devided by the groove 67 into portions where each memory cell is embedded. Undesirable magnetic field, if any, would be trapped in this groove, which is harmless site for the memory operation. If the structure shown in FIG. 6 is extended, it is possible to provide an integrated memory which has a further increased number of bits. Also, the storage device shown in FIG. 4A can be similarly used as a memory cell of an integrated memory.

Figure 7:
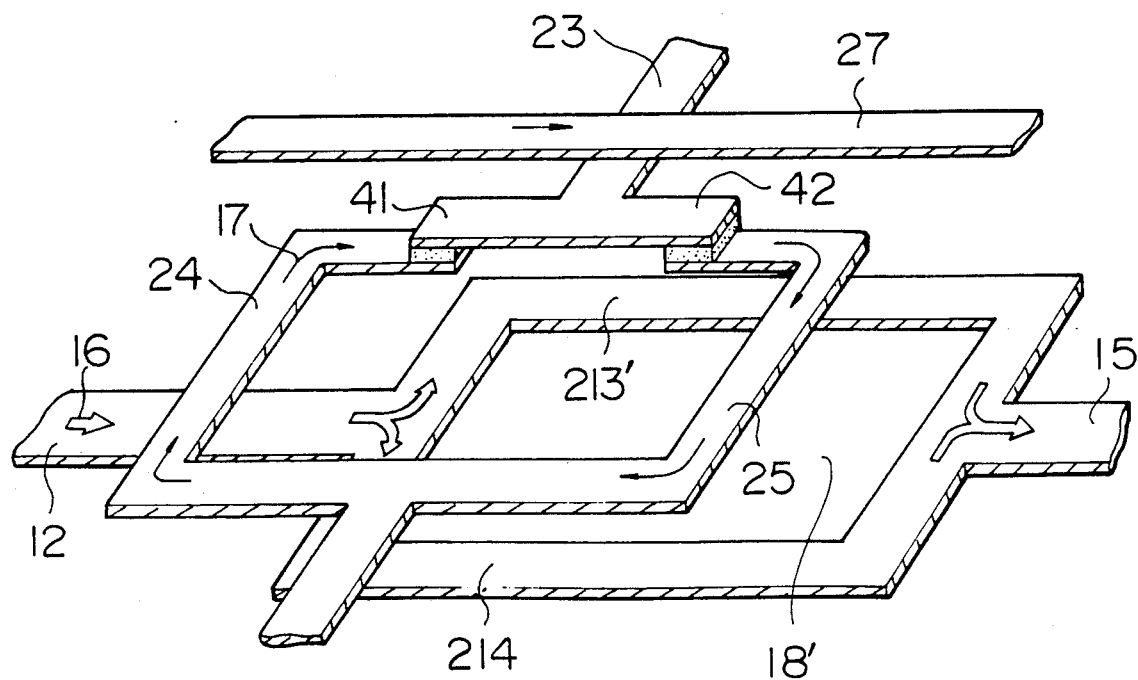
FIG. 7 is a view showing the structure of a superconductor storage device according to a further embodiment of the present invention.

FIG. 7 is a view showing a superconductor storage device according to a further embodiment of the present invention. The embodiment shown in FIG. 5A has the structure in which the opening 18 enclosed by the normal-conductor loop is smaller than the opening enclosed by the superconductor loop composed of the branch paths 24 and 25 and partially extends to the outside of the superconductor loop. However, it does not necessarily always required that the opening 18 of the normal-conductor loop is smaller than the opening of the superconductor loop. So long as only a part of the magnetic flux produced by the superconductor loop is allowed to pass through the opening 18 of the normal-conductor loop and a part of the opening 18 exists outside of the superconductor loop, an operation similar to that of the embodiment shown in FIGS. 5A and 5B is attainable. The principle of the operation of the embodiment shown in FIG. 7 is common to that of the embodiment shown in FIG. 5A but the construction of the embodiment of FIG. 7 is different from that of the embodiment of FIG. 5A as regards an opening 18' defined by branch paths 213' and 214'. Namely, the branch paths 213' and 214' of a normal-conductor loop are formed with its opening 18' the configuration and area of which are substantially the same as those of an opening defined by branch paths 24 and 25 of a superconductor loop but the position of which is shifted or displaced from that of the opening defined by the branch paths 24 and 25. Even with such a structure in which the superconductor loop and the normal-conductor loop having substantially the same opening are arranged in a shifted positional relation, an operation as shown in FIG. 5B can be realized.

Figure 3:
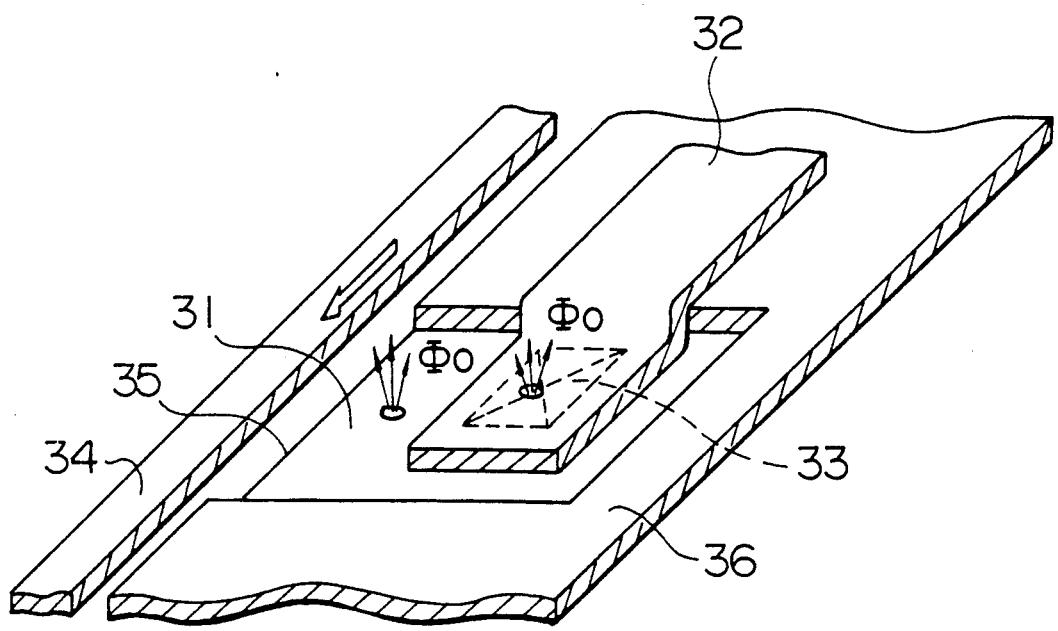
FIG. 3 is a view showing the structure of a further example of the conventional superconductor storage device.
Figure 8A:
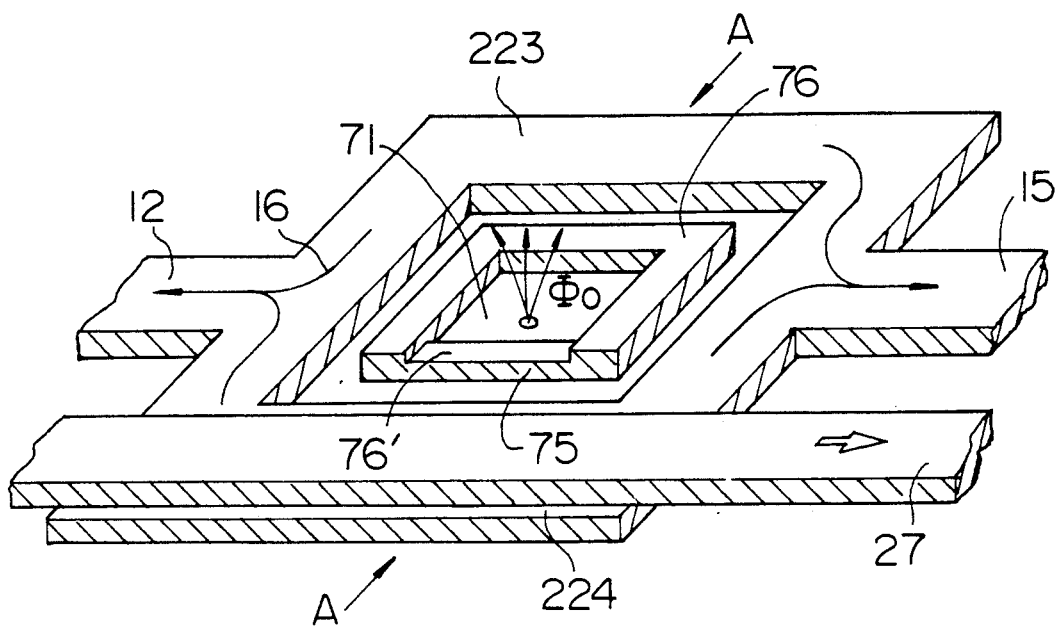
FIG. 8A is a view showing the structure of a superconductor storage device according to a still further embodiment of the present invention.
Figure 8B:
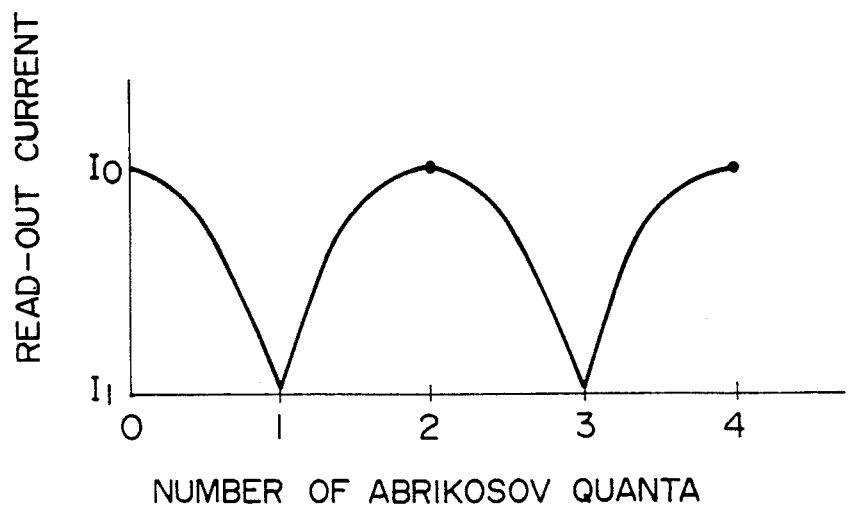
FIG. 8B is a graph showing a relation between the number of trapped Abrikosov flux quanta and a read-out current of the storage device shown in FIG. 8A.

FIG. 8A shows a superconductor storage device according to a still further embodiment of the present invention. The storage device of the present embodiment is an improved version of the conventional storage device of FIG. 3 in which information is stored having logical values "1" and "0" correspond to the presence and absence of an Abrikosov flux quantum. The storage device shown in FIG. 8A includes a thin superconductor 71 for retaining an Abrikosov flux quantum, a write-in line 27 provided near one end 75 of the superconductor 71, a superconductor 76 surrounding the superconductor 71 except the end 75 thereof and having a film thickness larger than that of the superconductor 71, a superconductor 76' provided along the end 75 of the superconductor 71 and having a film thickness larger than that of the superconductor 71 and smaller than that of the superconductor 76, and an incidence path 12, branch paths 223 and 224 and an exit path 15 for electron wave which are made of a normal conductor and in which an electron wave is propagated with a coherency thereof being kept. $\phi_0$ notionally represents the Abrikosov flux quantum. In this storage device, the presence and absence of an Abrikosov flux quantum to be retained in the superconductor 71 correspond to logical values "1" and "0", respectively. An odd number of (for example, one) Abrikosov flux quanta should be retained. Read-out of information is performed by flowing a read-out current 16 in the incidence path 12, the branch paths 223 and 224 and the exit path 15 which form an electron wave guide. Namely, owing to the Aharonov-Bohm effect, a relation between the number of Abrikosov flux quanta trapped in the superconductor 71 and a read-out current exhibits a trajectory as shown in FIG. 8B. Accordingly, a state in which no Abrikosov flux quantum is trapped and a state in which an odd number of (for example, one) Abrikosov flux quanta are trapped can be descriminated by values $I_0$ and $I_1$ ($I_0 > I_1$) of the read-out current.

Figure 8C:
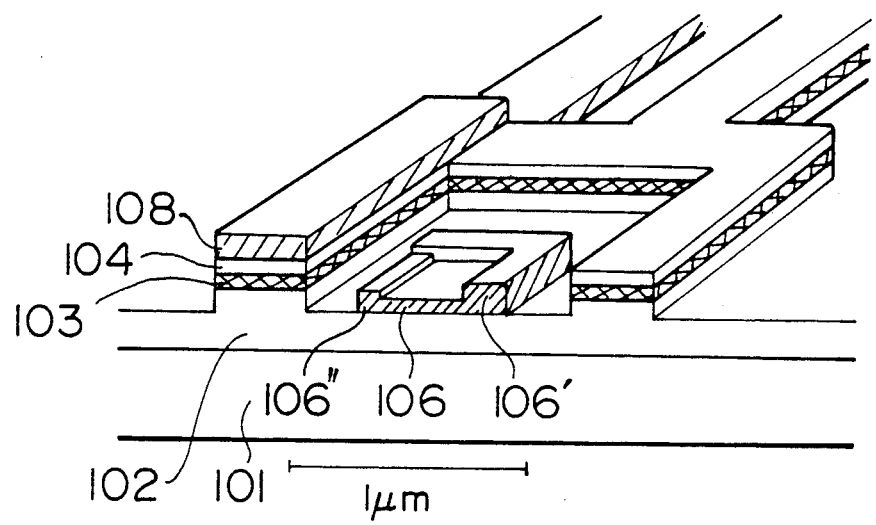
FIG. 8C is a perspective cross-sectional view of the storage device of FIG. 8A useful in explaining a fabrication method thereof.

FIG. 8C is a perspective view of a cross section of taken along lines A—A in FIG. 8A for explaining the method of fabrication of the storage device of the present embodiment. An undoped GaAs layer 102 having a thickness of 1 $\mu$m, an Se-doped GaAs layer 103 having an impurity concentration of $1 \times 10^{19}$ cm$^{-3}$ and a thickness of 100 Å, and an undoped GaAs layer 104 having a thickness of 200 Å are successively formed on a GaAs substrate 101 by means of MBE method. A part of the resultant structure is ion-etched by means of a mask. Thereafter, on a location where Nb layers 106, 106' and 160'' are to be formed, an Nb layer having a thickness of 1000 Å is formed by means of a lift-off sputtering method. Then, a portion of the Nb layer excepting a portion thereof which is to serve as the Nb layer 106' is etched till the top of the Nb layer 106" is exposed by means of a mask to form the Nb layer 106'. Then, using another mask, the Nb layer is further etched except a portion thereof which is to be served as the Nb layer 106", to thereby form the Nb layer 106" and the Nb layer 106 of 500 Å. Next, an Nb layer 108 having a thickness of 500 Å is formed by a lift-off sputtering method. The Se-doped GaAs layer 103 etched into a desired configuration provides the branch paths 223 and 224, the Nb layer 106 provides the superconductor 71 and the Nb layer 106' provides the thick superconductor 76. The film thickness of the thick superconductor 76 is 1000 Å. The Nb layer 108 provides the write-in line 27.

An Abrikosov flux quantum unsteadily moves without resting at one point, for example, when the temperature of a superconductor in which the Abrikosov flux quantum exists is increased. In the embodiment shown in FIG. 8A, the thin superconductor 71 is surrounded by the thick superconductors 76 and 76' in order to keep the Abrikosov flux quantum on the thin superconductor 71 in such a case. However, the method of keeping the Abrikosov flux quantum is not limited to the embodiment shown in FIG. 8A and various keeping methods may be employed.

Figure 8D:
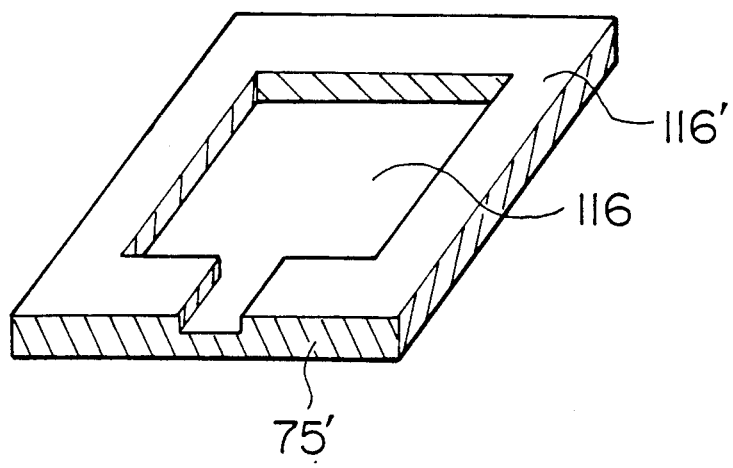
FIG. 8D is a view showing another structure of a part of the storage device shown in FIG. 8A.

FIG. 8D shows another structure for keeping the Abrikosov flux quantum on a thin superconductor. In the figure, a layer 116 is a thin superconductor and a layer 116' is a thick superconductor formed around the layer 116 excepting a part of an end 75' thereof facing the write-in line 27. Alternatively, the keeping of the Abrikosov flux quantum can be easily realized by means of well-known methods such as the formation of holes or the diffusion of impurity in the thin superconductor instead the method of using the wall-like superconductor as shown in FIG. 8A or 8D though such an alternative structure is not shown.

Figure 9:
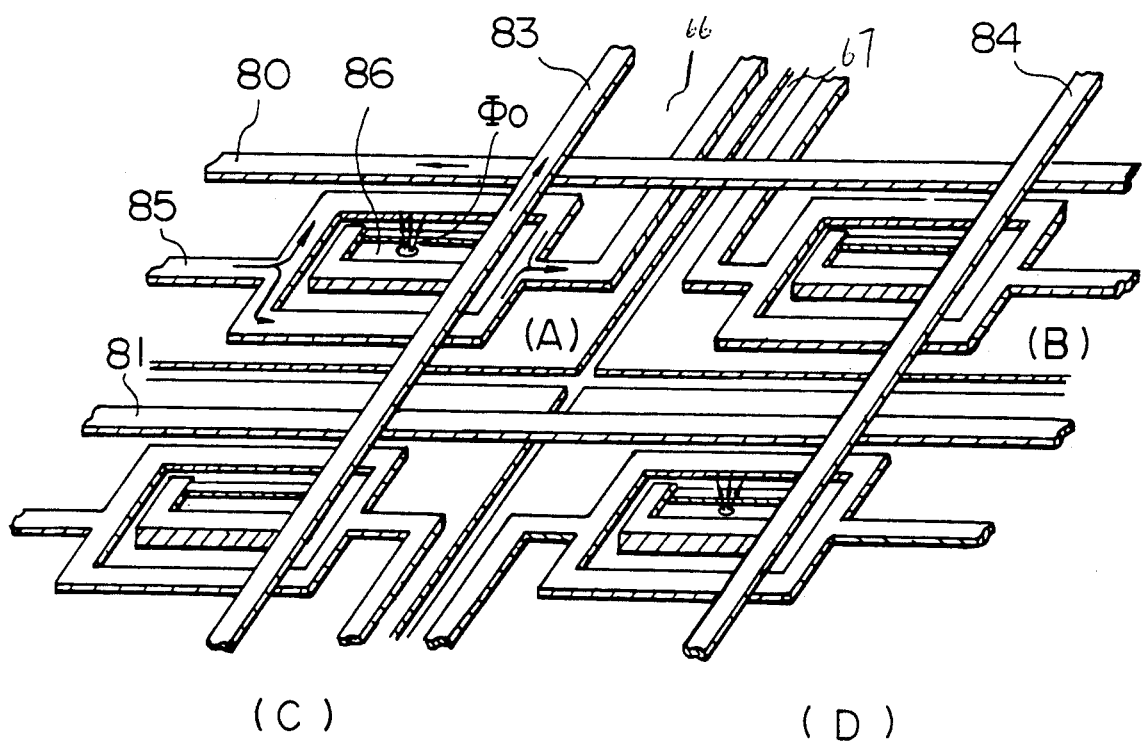
FIG. 9 is a view showing the structure of a 4-bit memory constructed using the storage device of FIG. 8A as a memory cell.

FIG. 9 is a schematic view of a 4-bit memory in which four storage devices each having the structure shown in FIG. 8A are arranged as memory cells (A), (B), (C) and (D). For example, in the case where information is to be written into the memory cell (A), a write-in line 80 and a write-in line 83 are used to trap an Abrikosov quantum $\phi_0$ in a superconductor thin film 86. Currents through the write-in lines 80 and 83 are preliminarily adjusted so that a magnetic field having a magnitude allowing to trap one Abrikosov quantum is applied to the superconductor thin film 86 when the currents are simultaneously flown in the two write-in lines 80 and 83. Write of information into the memory (B) is made using the write-in line 80 and a write-in line 84. In the case where the information written in the memory (A) is to be read out, a read-out current is flown in an electron waveguide 85 made of a normal conductor, thereby reading out the stored information in accordance with the principle mentioned in conjunction with the embodiment shown in FIG. 5. In this memory, each memory cell is fabricated on a superconducting layer 66, by which undesirable external magnetic field, if any, would be shielded due to the Meissner effect. The superconducting layer 66 is devided by a groove 67 into the portions where each memory cell is embedded. Undesirable magnetic field, if any, would be trapped in this groove, which is harmless site for the memory operation. If the structure shown in FIG. 9 is extended, it is possible to provide an integrated memory which has a further increased number of bits.

As has been mentioned above, the storage device according to the present invention is mainly utilized as a superconductor memory in which a magnetic flux produced by a superconductor current flowing in a superconductor is used as a carrier of information.

According to the present invention, novel information read-out means in a superconductor storage device is provided utilizing the Aharonov-Bohm effect. Therefore the present invention yields effects that the fabrication of the device is facilitated and an operation for read-out of stored information is simplified, as compared with the conventional superconductor device in which many Josephson junctions are used.

I claim:
1. A storage device comprising:
information write-in means for generating and annihilating a predetermined magnetic flux in accordance with information to be stored;
information retaining means for retaining said magnetic flux therein; and
information read-out means for detecting the retained magnetic flux, said information read-out means including magnetic flux detecting means placed to be subject to the influence of the magnetic flux retained in said information retaining means for splitting a material wave having charges into a plurality of material waves, allowing said plurality of material waves to travel, and allowing said plurality of material waves to superimpose and interfere with each other.

2. A storage device according to claim 1, wherein said information retaining means includes a superconductor in which a persistent current can be flown to retain said magnetic flux therein.

3. A storage device according to claim 2, wherein said superconductor is configured into a loop form.

4. A storage device according to claim 3, wherein said information read-out means includes a loop of normal conductor formed to enclose substantially the whole of the magnetic flux retained by said loop of superconductor, said loop of normal conductor being provided with an incidence path, an exit path and two branch paths of normal conductor for loop-wise connection of said incidence path and said exit path so that an electron wave is made incident and is branched into two parts and the two electron wave parts are allowed to travel and are combined again.

5. A storage device according to claim 3, wherein said information read-out means includes a loop of normal conductor which is formed to enclose a part of the magnetic flux retained by said loop of superconductor and to partially extend to the outside of said loop of superconductor, a predetermined voltage being allowed to be applied between two points on said loop of normal conductor.

6. A storage device according to claim 5, wherein said information read-out means further includes a conductor disposed so that a magnetic flux generated by said conductor when a predetermined current is flown in said conductor passes through that portion of said loop of normal conductor which exists outside of said loop of superconductor.

7. A storage device according to claim 1, wherein said information retaining means includes a thin film of superconductor for retaining an Abrikosov flux quantum, said magnetic flux being produced by said Abrikosov flux quantum.

8. A storage device comprising:

information write-in means for generating and annihilating a predetermined magnetic flux in accordance with information to be stored;

information retaining means for retaining said magnetic flux therein; and information read-out means for detecting the magnetic flux retained in said information retaining means, said information read-out means including a waveguide placed to be subject to the influence of the magnetic flux retained in said information retaining means for making a material wave having charges incident with a coherency thereof being kept, branching the incident material wave into a plurality of parts and making the material wave parts confluent again.

9. A storage device according to claim 8, wherein said information retaining means includes a superconductor in which a persistent current can be flown to retain said magnetic flux therein.

10. A storage device according to claim 8, wherein said information read-out means includes a loop of normal conductor having a space through which said magnetic flux passes, said loop of normal conductor being provided with an incidence path, an exit path and two branch paths of normal conductor for loop-wise connection of said incidence path and said exit path so that an electron wave is made incidence and is branched into two parts and the two electron wave parts are combined again.

11. A storage device according to claim 10, wherein a distance from a point at which the incident electron wave is branched to a point at which the two electron wave parts are combined is substantially equal to or smaller than a phase coherence distance of electrons in said branch path.

12. A storage device comprising:
a word line;
a write-in line;
a first loop of superconductor composed of two branch paths of superconductor connected to said word line so as to allow a current flowing in said word line to be retained in said first loop;
a weakly coupling portion inserted in one of said two branch paths, said weakly coupling portion being subject to the influence of a magnetic field generated by injection of a current into said write-in line to control the retention of said current in said first loop; and
a second loop of normal conductor provided to be magnetically coupled with said first loop, said second loop including an input path and an output path which allow the application of a voltage to said second loop and two branch paths of normal conductor which make a loop-wise connection between said input path and said output path.

13. A storage device according to claim 12, wherein said weakly coupling portion includes a Josephson element.

14. A storage device according to claim 12, wherein said weakly coupling portion is formed by making a part of said one of said two branch paths in said first loop narrow.

15. A storage device according to claim 12, wherein said second loop includes an Se-doped GaAs layer.

16. A storage device comprising:
a first line;
a second line;
a first loop of superconductor composed of two branch paths of superconductor connected to said first line so as to allow a current flowing in said first line to be retained in said first loop;
a weakly coupling portion inserted in each of said two branch paths, said weakly coupling portions being subject to the influence of a magnetic field generated by injection of a current into said second line to control the direction of a current flowing in said first loop in accordance with the direction of said current flowing in said first line; and
a second loop of normal conductor formed to be coupled with a part of a magnetic flux generated by said first loop and to partially extend to the outside of said first loop so as to be magnetically coupled with said second line, said second loop including an input path and an output path which allows the application of a voltage to said second loop and two branch paths of normal conductor which make a loop-wise connection between said input path and said output path.

17. A storage device according to claim 16, wherein each of said weakly coupling portions includes a Josephson element.

18. A storage device according to claim 16, wherein said weakly coupling portions are formed by making respective parts of said two branch paths in said first loop narrow.

19. A storage device according to claim 16, wherein said second loop includes an Se-doped GaAs layer.

20. A storage device comprising:
a write-in line;
a superconductor for generating or annihilating an Abrikosov flux quantum in accordance with a magnetic field by said write-in line; and
a loop of normal conductor having a space through which a magnetic flux generated by said Abrikosov flux quantum passes, said loop including an input path and an output path which allow the application of a voltage to said loop and two branch paths which make a loop-wise connection between said input path and said output path.

21. A memory comprising:
an array of memory cells arranged in columns and rows;
a word line for connecting each column of said memory cells; and
a write-in line provided for each row of said memory cells,
each of said memory cells including:
a first loop of superconductor composed of two branch paths of superconductor connected to associated word line so as to allow a current flowing in the associated word line to be retained in said first loop;
a weakly coupling portion inserted in one of said two branch paths, said weakly coupling portion being subject to the influence of a magnetic field generated by the injection of a current into said write-in line to control the retention of said current in said first loop; and
a second loop of normal conductor provided to be magnetically coupled with said first loop, said second loop including an input path and an output path which allow the application of a voltage to said second loop and two branch paths of normal conductor which make a loop-wise connection between said input path and said output path.

22. A memory comprising:

an array of memory cells arranged in columns and rows;

a first line for connecting each column of said memory cells; and a second line provided for each row of said memory cells, each of said memory cells including:

a first loop of superconductor composed of two branch paths of superconductor connected to associated first line so as to allow a current flowing in the associated first line to be retained in said first loop;

a weakly coupling portion inserted in each of said two branch paths, said weakly coupling portions being subject to the influence of a magnetic field generated by the injection of a current into said second line to control the retention of a current flowing in said first loop in accordance with the direction of said current flowing in said first loop; and a second loop of normal conductor formed to be coupled with a part of a magnetic flux generated by said first loop and to partially extend to the outside of said first loop so as to be magnetically coupled with said second line, said second loop including an input path and an output path which allow the application of a voltage to said second loop and two branch paths which make a loop-wise connection between said input path and said output path.

23. A memory according to claim 22, further comprising a superconducting layer, said memory cells being fabricated on said superconducting layer, said superconducting layer being devided by grooves into portions, at each of which a memory cell is embedded.

24. A memory comprising:

an array of memory cells arranged in columns and rows;

a first line provided for each row of said memory cells; and a second line provided for each column of said memory cells, each of said memory cells including:

a superconductor for generating and annihilating an Abrikosov flux quantum in accordance with a magnetic field generated by associated first and second lines; and a loop of normal conductor having a space through which a magnetic flux generated by said Abrikosov flux quantum passes, said loop including an input path and an output path which allow the application of a voltage to said loop and two branch paths of normal conductor which make a loop-wise connection between said input path and said output path.

* * * * *

UNITED STATES PATENT AND TRADEMARK OFFICE
CERTIFICATE OF CORRECTION

PATENT NO. : 5,051,787

DATED : September 24, 1991

INVENTOR(S) : Shuji HASEGAWA

It is certified that error appears in the above-identified patent and that said Letters Patent is hereby corrected as shown below:

| Column | Line | |
|---|---|---|
| 1 | 8 | Change "of" to --or--. |
| 1 | 30 | Change "pertistent" to --persistent--. |
| 1 | 55 | After "field" delete "." and insert --,--. |
| 1 | 56 | Change "Thereby" to --thereby--. |
| 2 | 59 | Change "IN" to --In--. |
| 3 | 32 | Change "notionally" to --notationally--. |
| 3 | 40 | Change "super-cur-" to -- supercur- --. |
| 7 | 42 | Change "to produce" to --production of--. |
| 9 | 41 | Change "dev-" to -- div- --. |
| 9 | 58 | Change "does" to --is--. |
| 10 | 36 | Change "notionally" to --notationally--. |
| 10 | 52 | Change "descriminated" to --discriminated--. |
| 10 | 54 | After "section of" insert --the superconductor storage device shown in Fig. 8A--. |

UNITED STATES PATENT AND TRADEMARK OFFICE
CERTIFICATE OF CORRECTION

PATENT NO. : 5,051,787
DATED : September 24, 1991
INVENTOR(S) : Shuji HASEGAWA

It is certified that error appears in the above-identified patent and that said Letters Patent is hereby corrected as shown below:

| Column | Line | |
|---|---|---|
| 11 | 35 | After "instead" insert --of--. |
| 11 | 51 | Change "Write" to --The writing--. |
| 11 | 53 | Change "writen" to --written--. |
| 16 | 6 | Change "devided" to --divided--. |

Signed and Sealed this

Thirteenth Day of April, 1993

Attest:

STEPHEN G. KUNIN

Attesting Officer    Acting Commissioner of Patents and Trademarks